(12) United States Patent
Funahashi et al.

(10) Patent No.: US 8,743,328 B2
(45) Date of Patent: Jun. 3, 2014

(54) MANUFACTURING METHOD FOR A LIQUID CRYSTAL DISPLAY DEVICE WHEREIN EACH SIDE OF A METAL PATTERN AND A SEMICONDUCTOR PATTERN FACING AN ETCHED SPACE IS CONTACTED BY AN INSULATING LAYER

(75) Inventors: Yuta Funahashi, Hyogo (JP); Tetsuya Kawamura, Hyogo (JP); Masafumi Hirata, Chiba (JP)

(73) Assignee: Panasonic Liquid Crystal Display Co., Ltd., Hyogo (JP)

( * ) Notice: Subject to any disclaimer, the term of this patent is extended or adjusted under 35 U.S.C. 154(b) by 208 days.

(21) Appl. No.: 12/944,543

(22) Filed: Nov. 11, 2010

(65) Prior Publication Data

US 2011/0116029 A1 May 19, 2011

(30) Foreign Application Priority Data

Nov. 16, 2009 (JP) ................................. 2009-260984

(51) Int. Cl.
*G02F 1/1333* (2006.01)
*G02F 1/13* (2006.01)

(52) U.S. Cl.
USPC .......................................... 349/138; 349/187

(58) Field of Classification Search
USPC .......................................... 349/106, 138, 187
See application file for complete search history.

(56) References Cited

U.S. PATENT DOCUMENTS

| 2002/0151116 | A1 | 10/2002 | Matsubara |
| 2005/0030461 | A1 | 2/2005 | Ono et al. |
| 2005/0046763 | A1 | 3/2005 | Ono et al. |
| 2007/0291194 | A1* | 12/2007 | Yoon ............................... 349/43 |
| 2008/0143909 | A1* | 6/2008 | Lee et al. ......................... 349/46 |

FOREIGN PATENT DOCUMENTS

| JP | 10-031209 | 2/1998 |
| JP | 2002-040479 | 2/2002 |
| JP | 2002-296615 | 10/2002 |
| JP | 2004-177895 | 6/2004 |
| JP | 2005-77424 | 3/2005 |
| JP | 2005-077424 | 3/2005 |
| WO | 01/18597 | 3/2001 |

* cited by examiner

*Primary Examiner* — Paul Lee
(74) *Attorney, Agent, or Firm* — Hamre, Schumann, Mueller & Larson, P.C.

(57) ABSTRACT

Provided is a manufacturing method for a liquid crystal display device, in which a semiconductor pattern and a metal pattern are formed so that the semiconductor pattern includes a first portion formed under the metal pattern and a second portion which outwardly extends off the metal pattern from the first portion. An insulating layer for covering the metal pattern and the semiconductor pattern is formed. The insulating layer is subjected to etching in a first region located above the metal pattern and in a second region located above at least the second portion of the semiconductor pattern. In the etching step, the insulating layer in the first region is subjected to etching to form a through hole for electrical connection to the metal pattern, and the insulating layer and the semiconductor pattern in the second region are subjected to etching to remove the second portion of the semiconductor pattern.

14 Claims, 15 Drawing Sheets

MANUFACTURING METHOD FOR A LIQUID CRYSTAL DISPLAY DEVICE WHEREIN EACH SIDE OF A METAL PATTERN AND A SEMICONDUCTOR PATTERN FACING AN ETCHED SPACE IS CONTACTED BY AN INSULATING LAYER

CROSS-REFERENCE TO RELATED APPLICATION

The present application claims priority from Japanese application JP 2009-260984 filed on Nov. 16, 2009, the content of which is hereby incorporated by reference into this application.

BACKGROUND OF THE INVENTION

1. Field of the Invention

The present invention relates to a liquid crystal display device and a manufacturing method therefor.

2. Description of the Related Art

In an active matrix liquid crystal display device, a semiconductor layer and a metal layer are laminated so as to form a thin-film transistor. In a bottom-gate thin-film transistor, a drain electrode, a source electrode, and a drain wiring (wiring which is supplied with a video signal for driving a pixel electrode), which are patterned from the metal layer, are formed on the semiconductor layer. In such a structure, in some cases, the semiconductor layer is used to reduce a difference in level in, for example, a region where the drain wiring overlaps a wiring intersecting therewith, such as a source wiring (WO 01/018597).

Further, in recent years, resolution in display region has been improved. Accordingly, there is a case where two drain wirings are formed for a single pixel (JP 2005-77424 A).

In a method in which the metal layer, which becomes the drain electrode, the source electrode, and the drain wiring to be connected to the drain electrode, is patterned after the semiconductor layer is patterned, considering misalignment, the semiconductor layer is formed larger in width than the metal layer overlapping the semiconductor layer. Therefore, the semiconductor layer under the drain wiring is formed to extend off the drain wiring particularly in a region where the semiconductor layer overlaps another wiring intersecting therewith.

Further, in a method in which the metal layer is laminated on the semiconductor layer, and the metal layer and the semiconductor layer are continuously patterned using a single etching resist, the metal layer becomes smaller than the etching resist due to side etching during wet etching, and hence the semiconductor layer under the drain wiring extends off the drain wiring.

In the case where two drain wirings are formed for a single pixel as described in JP 2005-77424 A, there is a possibility that the extending semiconductor layers which are formed under the adjacent drain wirings, respectively, are brought into contact with each other. This may cause electrical short circuit. In order to avoid this situation, it is conceivable to widen a gap between the drain wirings. In this case, however, because light scattering occurs on the drain wiring, a black matrix which is larger in width than the drain wiring is required. Moreover, when the gap between the drain wirings is widened, an aperture ratio inevitably decreases.

SUMMARY OF THE INVENTION

The present invention has an object to provide a liquid crystal display device in which a semiconductor pattern formed under a metal pattern is appropriately processed.

(1) According to the present invention, a manufacturing method for a liquid crystal display device includes: forming a semiconductor pattern and a metal pattern on a first substrate, the semiconductor pattern including a first portion formed under the metal pattern and a second portion which outwardly extends off the metal pattern from the first portion; forming an insulating layer for covering the metal pattern and the semiconductor pattern; etching the insulating layer in a first region located above the metal pattern and a second region located above at least the second portion of the semiconductor pattern; and then providing liquid crystal between the first substrate and a second substrate facing the first substrate, the liquid crystal being surrounded by a seal portion so as to be sealed, in which the etching includes etching, in the first region, the insulating layer to form a through hole for electrical connection to the metal pattern, and etching, in the second region, the insulating layer and the semiconductor pattern to remove the second portion of the semiconductor pattern. According to the present invention, the second portion of the semiconductor pattern is removed in a step of forming the through hole for electrical connection, and hence the semiconductor pattern may be appropriately processed without increasing the number of manufacturing steps.

(2) In the manufacturing method for a liquid crystal display device described in Item (1), the metal pattern may include a plurality of wirings arranged in parallel to one another with a gap formed therebetween, and the second portion of the semiconductor pattern may be located below a region between adjacent wirings of the plurality of wirings.

(3) In the manufacturing method for a liquid crystal display device described in Item (1), the second region may be located above the first portion and the second portion of the semiconductor pattern and the metal pattern on the first portion, and the etching may include removing the second portion of the semiconductor pattern while leaving the first portion unremoved with a use of the metal pattern on the first portion as a mask.

(4) In the manufacturing method for a liquid crystal display device described in Item (3), the metal pattern may include a wiring, and the second portion of the semiconductor pattern may extend off each of both sides of the wiring in a width direction of the wiring.

(5) In the manufacturing method for a liquid crystal display device described in Item (1), the metal pattern may include a plurality of first wirings formed in a region surrounded by the seal portion and a plurality of second wirings formed in a region outside the region surrounded by the seal portion, the plurality of first wirings may be arranged in parallel to one another with a gap formed therebetween and the second portion to be etched may be located below a region between adjacent first wirings of the plurality of first wirings, and the plurality of second wirings may be arranged in parallel to one another with a gap formed therebetween and a third portion of the semiconductor pattern, which is to be left unremoved in the etching, may be located below a region between adjacent second wirings of the plurality of second wirings.

(6) The manufacturing method for a liquid crystal display device described in any one of Items (1) to (5) may further include, after the etching, filling a space formed by removing the second portion, with an insulating material.

(7) In the manufacturing method for a liquid crystal display device described in Item (6), the insulating material may be a material of a colored layer providing at least one color of a color filter.

(8) According to the present invention, a liquid crystal display device includes: a first substrate on which a thin-film transistor is formed; a second substrate facing the first substrate; liquid crystal provided between the first substrate and the second substrate; and a seal portion formed around the liquid crystal between the first substrate and the second substrate, in which: the first substrate includes a semiconductor pattern and a metal pattern formed in a state in which the semiconductor pattern is formed under the metal pattern; and the semiconductor pattern has a side surface which is flush with a side surface of the metal pattern.

(9) According to the present invention, a liquid crystal display device includes: a first substrate on which a thin-film transistor is formed; a second substrate facing the first substrate; liquid crystal provided between the first substrate and the second substrate; and a seal portion formed so as to surround the liquid crystal between the first substrate and the second substrate, in which: the first substrate includes a semiconductor pattern and a metal pattern formed in a state in which the semiconductor pattern is formed under the metal pattern; the semiconductor pattern and the metal pattern are formed to reach, from a region surrounded by the seal portion, a region outside the region surrounded by the seal portion; in the region outside the region surrounded by the seal portion, the semiconductor pattern includes a portion formed under the metal pattern and a portion which extends off the metal pattern; and in the region surrounded by the seal portion, the semiconductor pattern has a side surface which is flush with a side surface of the metal pattern.

DETAILED DESCRIPTION OF THE INVENTION

Hereinafter, embodiments of the present invention are described with reference to the drawings.

First Embodiment

FIGS. 1A to 4 are views illustrating a manufacturing method for a liquid crystal display device according to a first embodiment of the present invention. FIG. 1B is a cross-sectional view taken along the line IB-IB of a structure illustrated in FIG. 1A. FIG. 2B is a cross-sectional view taken along the line IIB-IIB of a structure illustrated in FIG. 2A. FIG. 3B is a cross-sectional view taken along the line IIIB-IIIB of a structure illustrated in FIG. 3A.

Figure 1A:
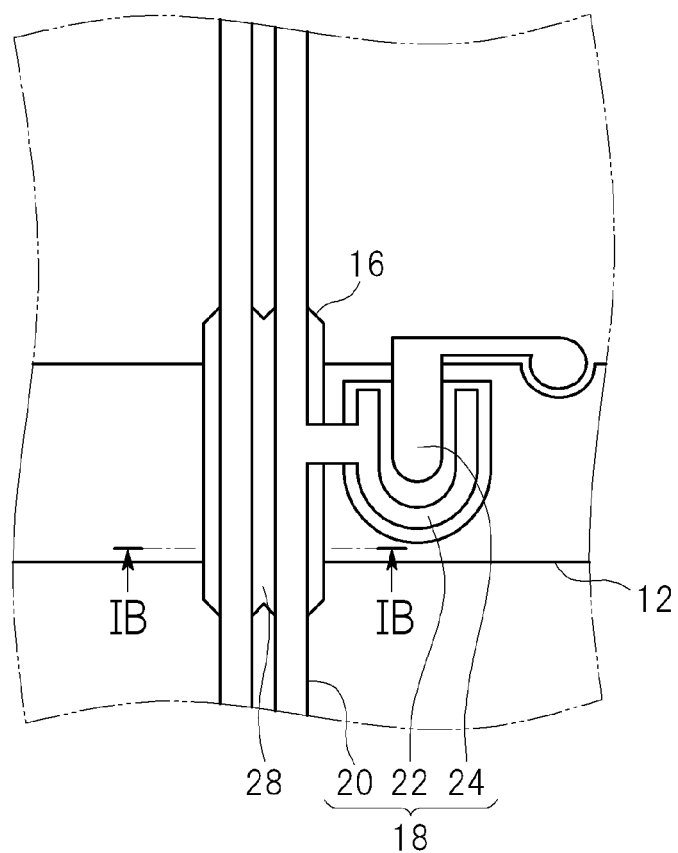
FIG. 1A is a view illustrating a manufacturing method for a liquid crystal display device according to a first embodiment of the present invention.
Figure 1B:
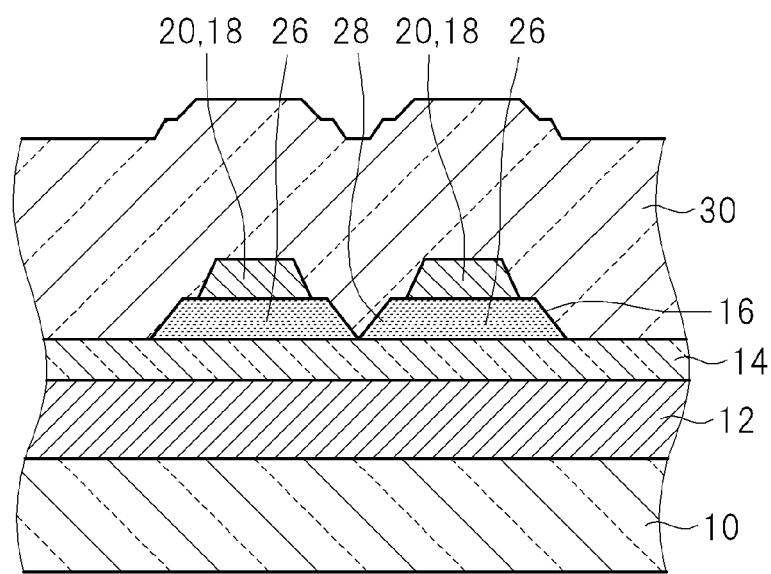
FIG. 1B is a cross-sectional view taken along the line IB-IB of a structure illustrated in FIG. 1A.

In this embodiment, as illustrated in FIG. 1B, a first substrate 10 is prepared. The first substrate 10 is formed of a light transmissive material. A gate wiring 12 is formed on the first substrate 10. The gate wiring 12 has a portion which serves as a gate electrode of a thin-film transistor, and is formed of a metal such as copper. The gate wiring 12 may be formed by forming a metal film on an entire surface of the first substrate 10, and then subjecting the metal film to etching. A gate insulating film 14 is formed above the first substrate 10 so as to cover the gate wiring 12. The gate insulating film 14 is formed of an inorganic material (for example, silicon nitride (SiN)).

As illustrated in FIGS. 1A and 1B, a semiconductor pattern 16 and a metal pattern 18 are formed on the gate insulating film 14. The semiconductor pattern 16 may be formed at the same time when a semiconductor layer of the thin-film transistor is formed, and may be formed of the same material as the semiconductor layer (semiconductor material such as amorphous silicon). However, the semiconductor pattern 16 is not a part of the thin-film transistor. The gate wiring 12 is formed under the gate insulating film 14, and hence a convex portion is formed on a surface of the gate insulating film 14 due to the thickness of the gate wiring 12. Therefore, there is a difference in level formed on the surface of the gate insulating film 14. In order to reduce the difference in level, the semiconductor pattern 16 is formed on the gate insulating film 14. The semiconductor pattern 16 is formed so as to three-dimensionally intersect with the gate wiring 12 through intermediation of the gate insulating film 14.

The metal pattern 18 includes a plurality of wirings 20 (also referred to as data wirings) which are arranged in parallel to one another with a gap formed therebetween. The wirings 20 are formed so as to three-dimensionally intersect with the gate wiring 12. More specifically, each of the wirings 20 includes a portion overlapping the gate wiring 12, the gate insulating film 14, and the semiconductor pattern 16, a portion overlapping the gate insulating film 14 and the semiconductor pattern 16 though not overlapping the gate wiring 12, and a portion overlapping the gate insulating film 14 though not overlapping the gate wiring 12 and the semiconductor pattern 16.

The metal pattern 18 further includes a drain electrode 22 and a source electrode 24 which are separated (electrically insulated) from each other. One of the drain electrode 22 and the source electrode 24 is connected to one of the wirings 20. The wiring 20 connected to the drain electrode 22 is referred to as drain wiring. The drain electrode 22 and the source electrode 24 are laid on the semiconductor layer, to thereby form the thin-film transistor.

The semiconductor pattern 16 includes first portions 26 which are formed under the metal pattern 18 (wirings 20) and a second portion 28 which outwardly extends off the metal pattern 18 (wirings 20) from the first portions 26. The first portions 26 are formed in contact with the wirings 20, respectively. The second portion 28 of the semiconductor pattern 16 is located below a region between the adjacent wirings 20. The second portion 28 is integrally formed with the first portions 26.

Next, an insulating layer 30 for covering the metal pattern 18 and the semiconductor pattern 16 is formed. The insulating layer 30 is formed of an inorganic material (for example, silicon dioxide (SiO$_2$)).

Figure 2A:
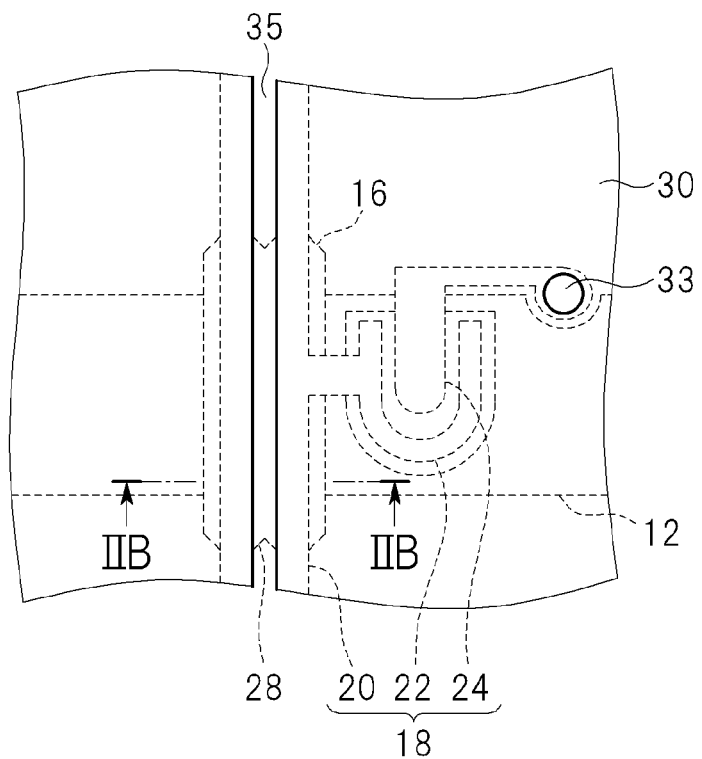
FIG. 2A is a view illustrating the manufacturing method for a liquid crystal display device according to the first embodiment of the present invention.
Figure 2B:
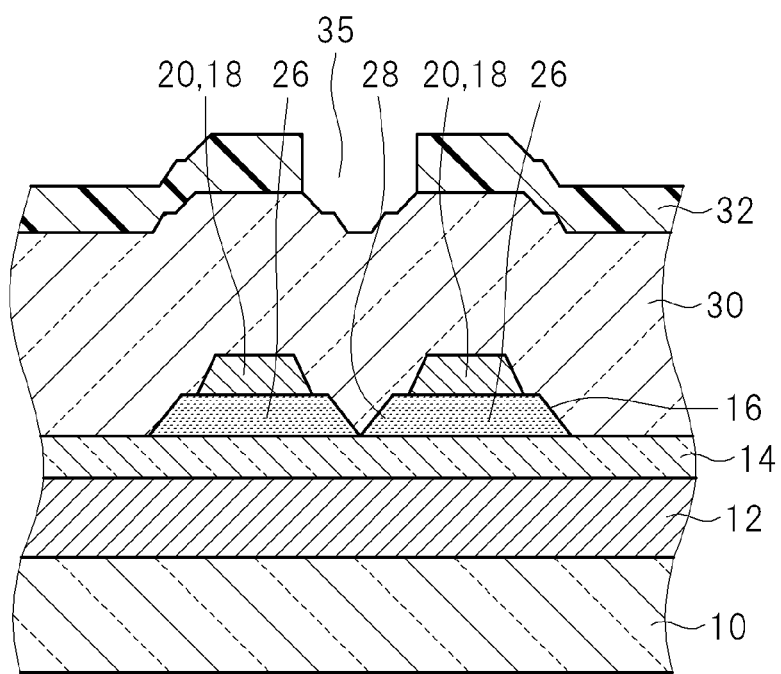
FIG. 2B is a cross-sectional view taken along the line IIB-IIB of a structure illustrated in FIG. 2A.

As illustrated in FIG. 2B, an etching resist 32 is formed on the insulating layer 30. The etching resist 32 is formed of a photo resist, and is patterned by photolithography.

Figure 3A:
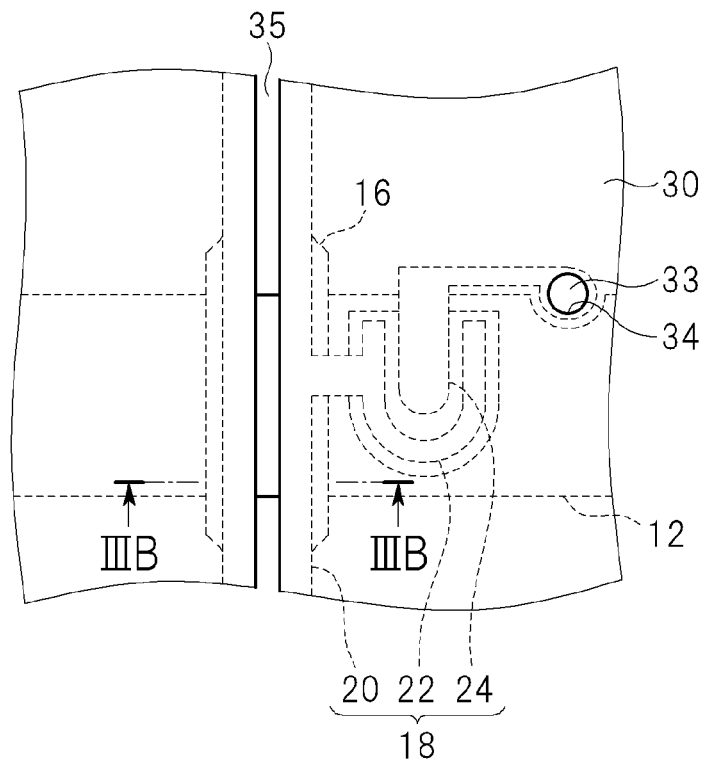
FIG. 3A is a view illustrating the manufacturing method for a liquid crystal display device according to the first embodiment of the present invention.
Figure 3B:
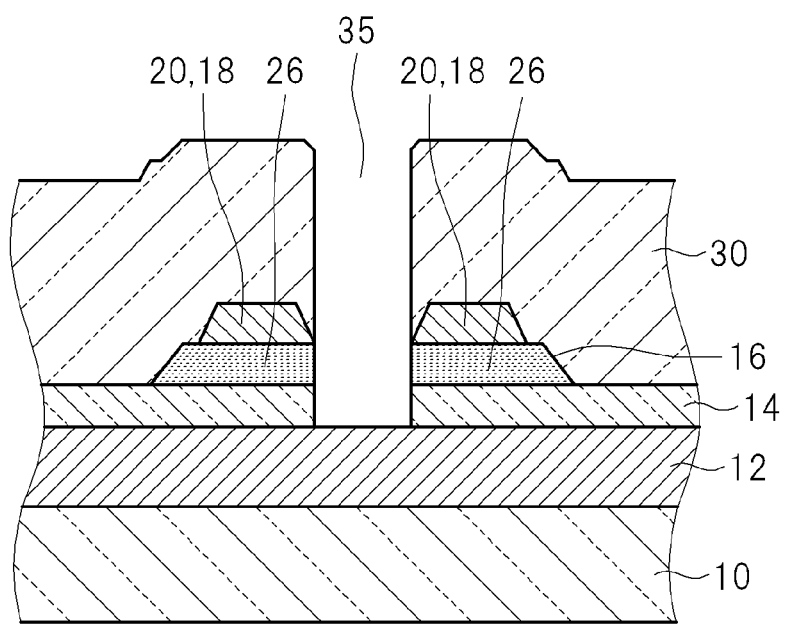
FIG. 3B is a cross-sectional view taken along the line IIIB-IIIB of a structure illustrated in FIG. 3A.

As illustrated in FIGS. 3A and 3B, the insulating layer 30 is subjected to etching. The etching is performed using the etching resist 32 as a mask. More specifically, the insulating layer 30 is subjected to etching (for example, dry etching) in a first region 33 located above the metal pattern 18 (specifically, one of the drain electrode 22 and the source electrode 24) and a second region 35 located above at least the second portion 28 of the semiconductor pattern 16.

In the etching step, the insulating layer 30 in the first region 33 is subjected to etching to form a through hole 34 for electrical connection to the metal pattern 18 (specifically, one of the drain electrode 22 and the source electrode 24) (see FIG. 3A). At the same time, the insulating layer 30 and the semiconductor pattern 16 in the second region 35 are subjected to etching, to thereby remove the second portion 28 of the semiconductor pattern 16 (see FIG. 3B). With this etching, the first portions 26 formed under the adjacent wirings 20, respectively, are separated from each other.

The etching may be performed so as to pass through the semiconductor pattern 16 and reach the gate insulating film 14. However, when an etching speed of a material (for example, SiN) forming the gate insulating film 14 is lower than an etching speed of a material (for example, amorphous silicon) forming the semiconductor pattern 16, it becomes easy to stop the etching before passing through the gate insulating film 14.

According to this embodiment, the second portion 28 of the semiconductor pattern 16 is removed in a step of forming the through hole 34 for electrical connection, and hence the semiconductor pattern 16 may be appropriately processed without increasing the number of manufacturing steps. More specifically, if the second portion 28 of the semiconductor pattern 16 remains between the adjacent wirings 20, there is a fear that carriers are generated when light enters the second portion 28, to thereby cause electrical connection between the adjacent wirings 20. However, the second portion 28 is removed in this embodiment, and hence electrical connection between the adjacent wirings 20 may be prevented. Further, it is unnecessary to widen the gap between the adjacent wirings 20 so as to prevent the electrical connection therebetween.

Figure 4:
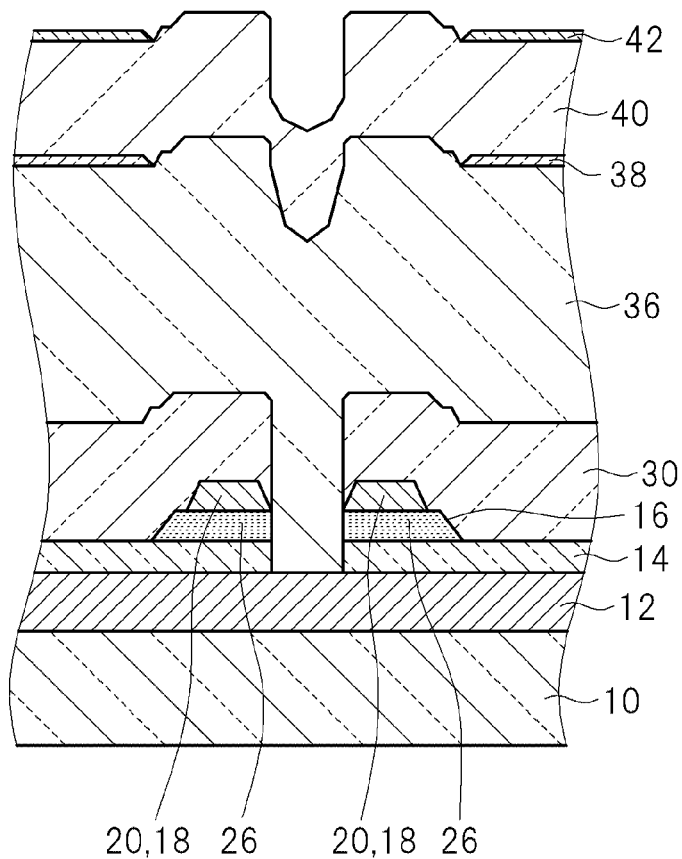
FIG. 4 is a view illustrating the manufacturing method for a liquid crystal display device according to the first embodiment of the present invention.

As illustrated in FIG. 4, after the etching step, a space formed by removing the second portion 28 is filled with an insulating material (inorganic material or organic material), to thereby form a first passivation film 36. The first passivation film 36 is formed so as to be laid on the insulating layer 30.

In a case of an in-plane switching (IPS) liquid crystal display device, a first electrode 38 is formed on the first passivation film 36. Then, a second passivation film 40 is formed on the first passivation film 36 so as to cover the first electrode 38, and a second electrode 42 is formed thereon. One of the first electrode 38 and the second electrode 42 serves as a pixel electrode, while the other thereof serves as a common electrode. The pixel electrode and the common electrode are each formed of a transparent conductive material such as indium tin oxide (ITO).

Figure 5:
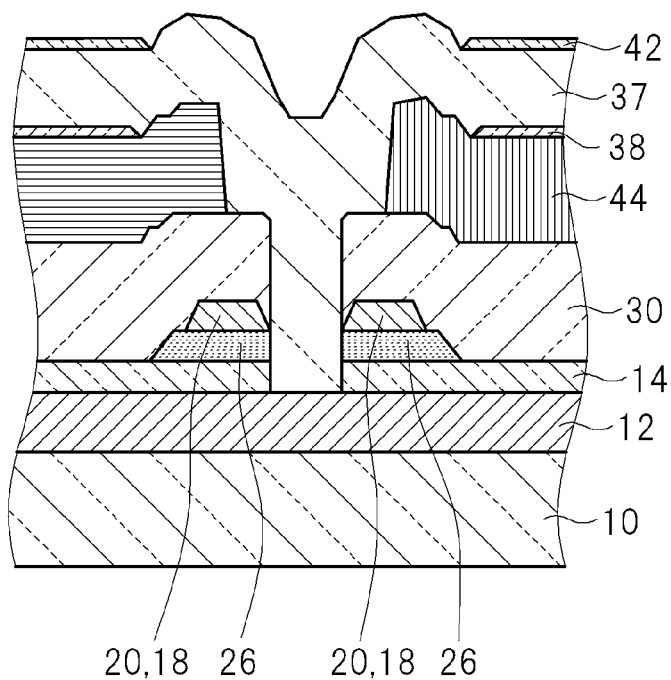
FIG. 5 is a view illustrating a first modified example of the first embodiment.

A first modified example may be configured as follows. As illustrated in FIG. 5, a color filter layer 44 may be formed in a region avoiding the space formed by removing the second portion 28, and the space formed by removing the second portion 28 may be filled with an insulating material (inorganic material, organic material, material for color filter, or light shielding material), to thereby form a passivation film 37. The passivation film 37 is formed so as to be laid on the color filter layer 44. In the case of the in-plane switching (IPS) liquid crystal display device, the first electrode 38 is formed on the color filter layer 44. Then, the passivation film 37 is formed on the color filter layer 44 so as to cover the first electrode 38, and the second electrode 42 is formed thereon. One of the first electrode 38 and the second electrode 42 serves as a pixel electrode, while the other thereof serves as a common electrode.

Figure 6:
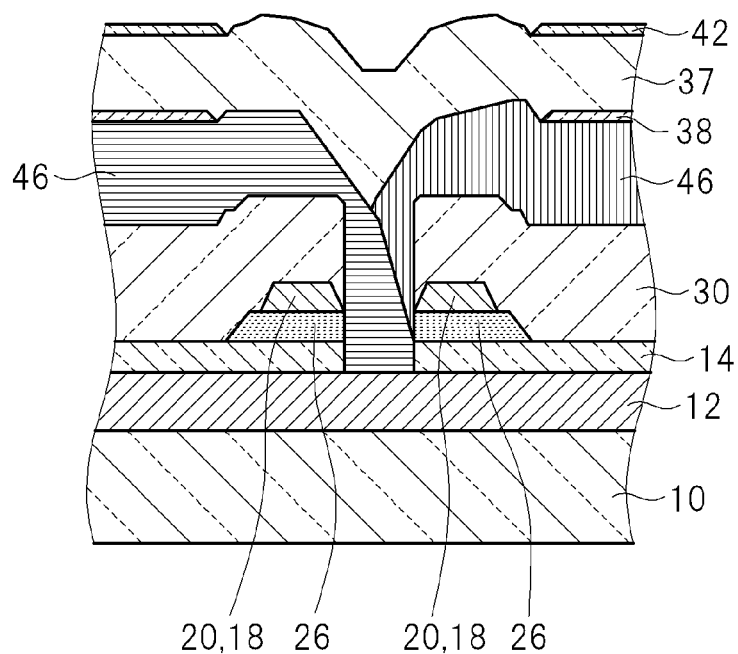
FIG. 6 is a view illustrating a second modified example of the first embodiment.

A second modified example may be configured as follows. As illustrated in FIG. 6, a material of a colored layer 46 providing at least one color of a color filter may be used as the insulating material for filling the space formed by removing the second portion 28. For example, ends of adjacent colored layers 46 in the color filter layer 44 are brought together to fill the space formed by removing the second portion 28. Then, the passivation film 37 is formed on the color filter layer 44. Other structures are the same as those exemplified in FIG. 5.

Figure 7:
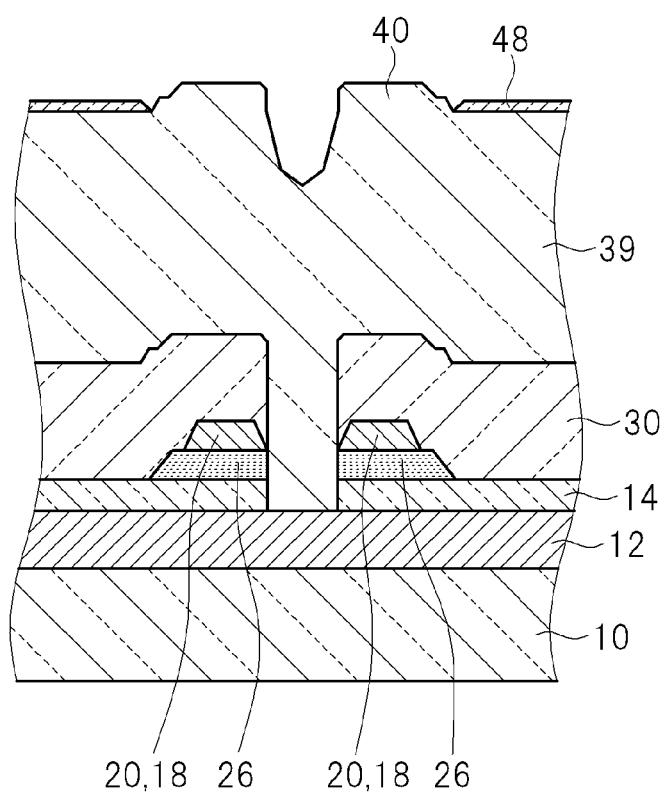
FIG. 7 is a view illustrating a third modified example of the first embodiment.
Figure 8:
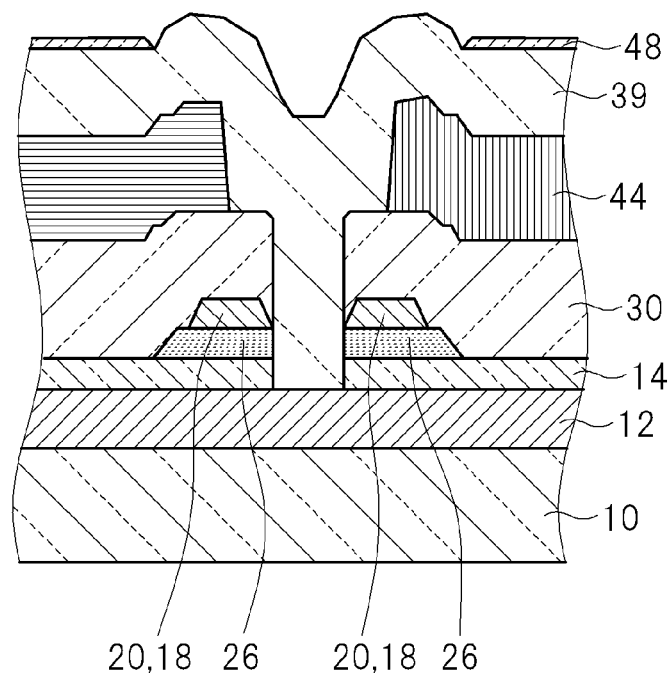
FIG. 8 is a view illustrating a fourth modified example of the first embodiment.
Figure 9:
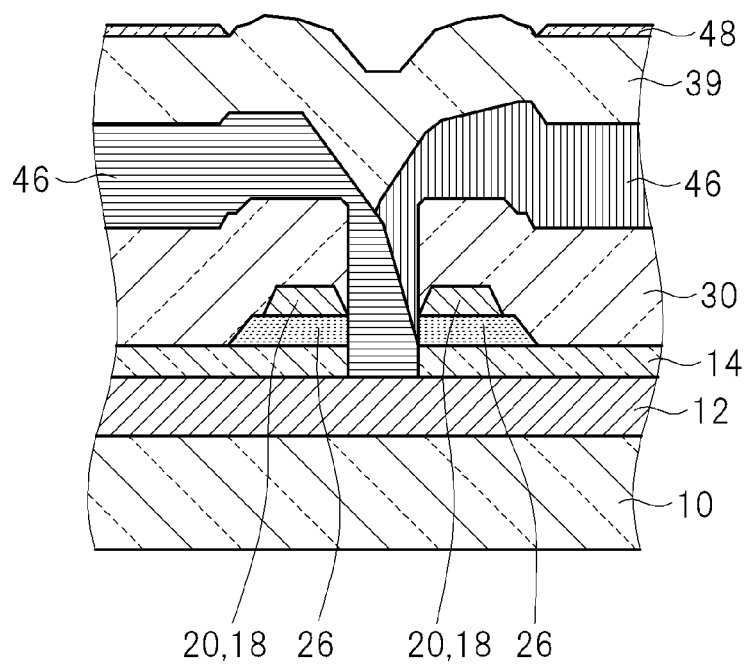
FIG. 9 is a view illustrating a fifth modified example of the first embodiment.

Other modified examples may be configured as follows. In order to modify the liquid crystal display device exemplified in FIG. 4 to a vertical alignment (VA) liquid crystal display device, as illustrated in FIG. 7, a pixel electrode 48 is formed on a passivation film 39. Further, in order to modify the liquid crystal display device exemplified in FIG. 5 to a vertical alignment (VA) liquid crystal display device, as illustrated in FIG. 8, the pixel electrode 48 is formed on the passivation film 39. Further, in order to modify the liquid crystal display device exemplified in FIG. 6 to a vertical alignment (VA) liquid crystal display device, as illustrated in FIG. 9, the pixel electrode 48 is formed on the passivation film 39.

After that, a well-known manufacturing process for the liquid crystal display device is performed, and thus the liquid crystal display device may be manufactured.

Second Embodiment

FIGS. 10A to 12 are views illustrating a manufacturing method for a liquid crystal display device according to a second embodiment of the present invention. FIG. 10B is a cross-sectional view taken along the line XB-XB of a structure illustrated in FIG. 10A. FIG. 11B is a cross-sectional view taken along the line XIB-XIB of a structure illustrated in FIG. 11A.

In this embodiment, the first substrate 10, the gate wiring 12, and the gate insulating film 14 correspond to those described in the first embodiment.

Figure 10A:
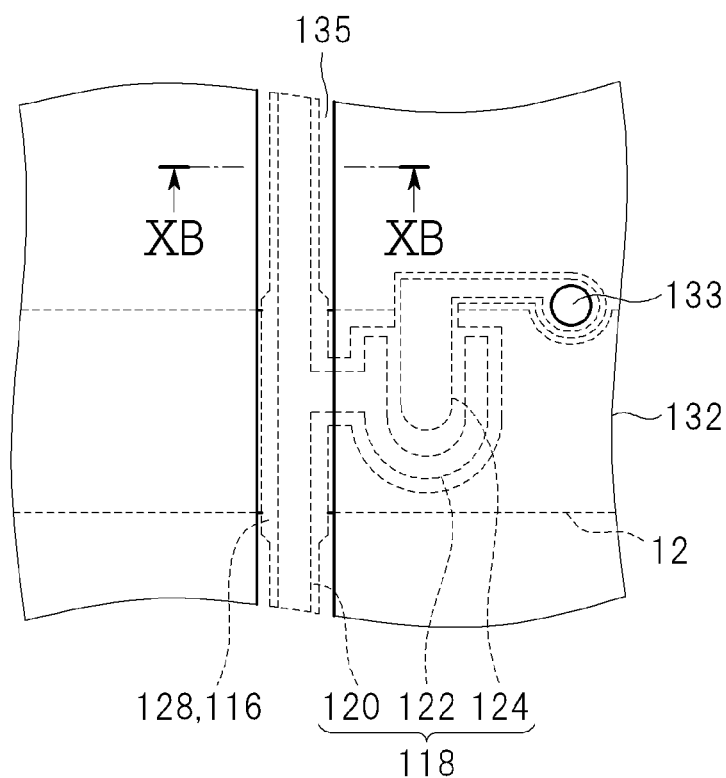
FIG. 10A is a view illustrating a manufacturing method for a liquid crystal display device according to a second embodiment of the present invention.
Figure 10B:
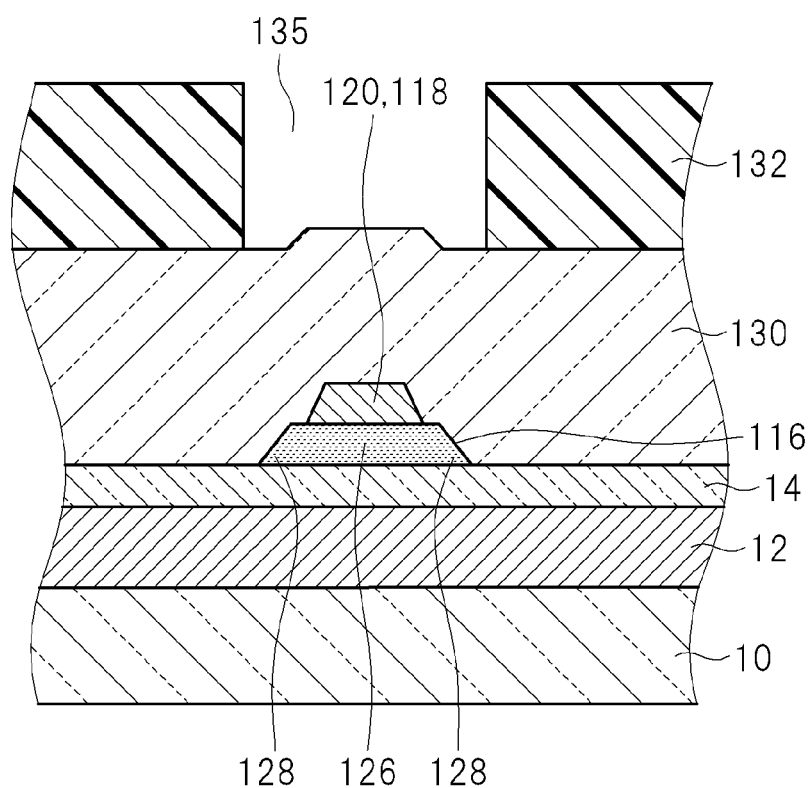
FIG. 10B is a cross-sectional view taken along the line XB-XB of a structure illustrated in FIG. 10A.

As illustrated in FIGS. 10A and 10B, a semiconductor pattern 116 and a metal pattern 118 are formed on the gate insulating film 14. Further, in the same layer as the semiconductor pattern 116, the semiconductor layer of the thin-film transistor is formed. The summary of a method of forming the semiconductor pattern and the semiconductor layer is as follows (not shown). The semiconductor film and the metal film are laminated, and the semiconductor film and the metal film are subjected to etching a plurality of times using the same etching resist. In this method, because the same etching resist is used, a photolithography process for forming the etching resist is performed only once. However, because the metal pattern 118 is subjected to side etching, as illustrated in FIG. 10B, the width of the metal pattern 118 becomes smaller than that of the semiconductor pattern 116 formed under the metal pattern 118. Details thereof are well known, and hence description thereof is omitted.

The semiconductor pattern 116 is formed under the entire metal pattern 118. Therefore, the metal pattern 118 includes a portion overlapping the gate wiring 12, the gate insulating film 14, and the semiconductor pattern 116, and a potion overlapping the gate insulating film 14 and the semiconductor pattern 116 though not overlapping the gate wiring 12. However, this embodiment differs from the first embodiment in that the metal pattern 118 does not include a portion not overlapping the semiconductor pattern 116.

The metal pattern 118 includes a wiring 120 (also referred to as data wiring). The wiring 120 is formed so as to three-dimensionally intersect with the gate wiring 12. The metal pattern 118 includes a drain electrode 122 and a source electrode 124, which is similar to the first embodiment.

The semiconductor pattern 116 includes a first portion 126 which is formed under the metal pattern 118 (wiring 120) and second portions 128 which outwardly extend off the metal pattern 118 (wiring 120) from the first portion 126. The first portion 126 is formed in contact with the wiring 120. The second portions 128 of the semiconductor pattern 116 extend off both sides of the wiring 120, respectively, in the width direction of the wiring 120. The second portions 128 are integrally formed with the first portion 126.

Next, an insulating layer 130 for covering the metal pattern 118 and the semiconductor pattern 116 is formed. The insulating layer 130 is formed of an inorganic material (for example, SiO₂). Then, an etching resist 132 is formed on the insulating layer 130. The etching resist 132 is formed of a photo resist, and is patterned by photolithography.

Figure 11A:
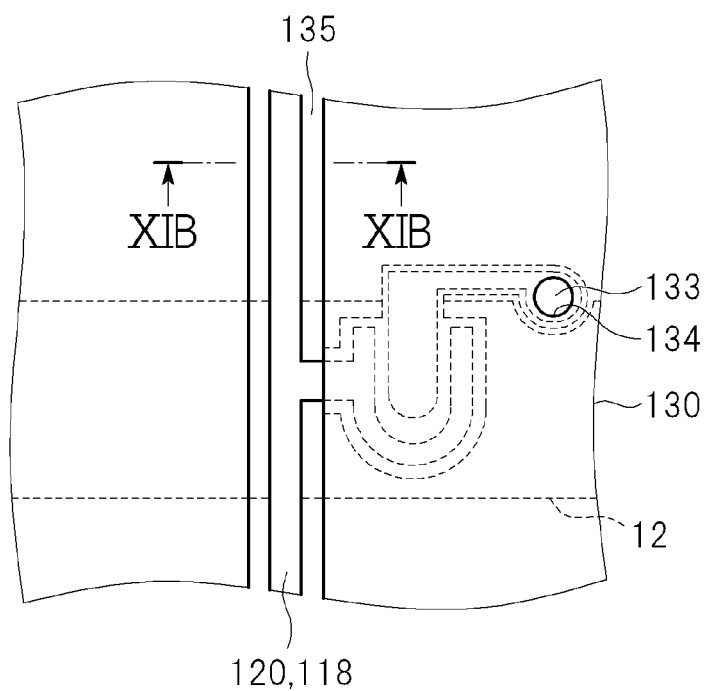
FIG. 11A is a view illustrating the manufacturing method for a liquid crystal display device according to the second embodiment of the present invention.
Figure 11B:
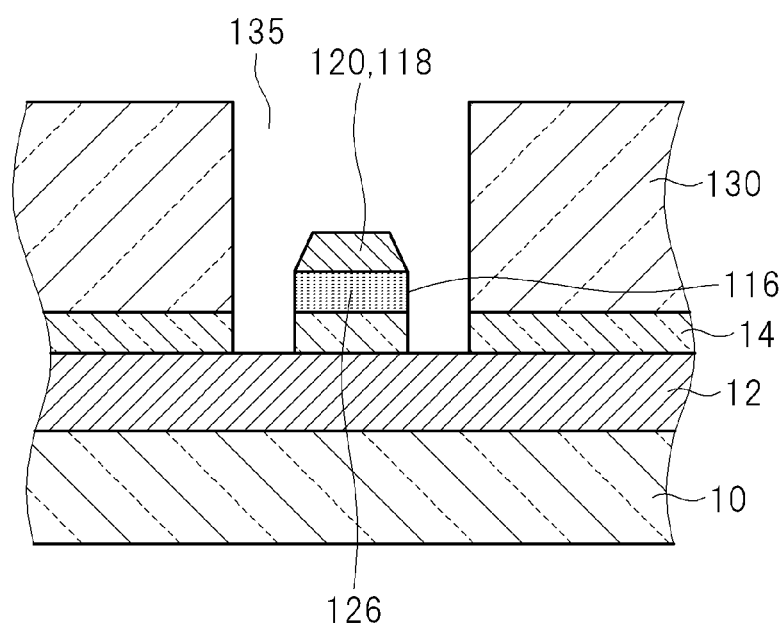
FIG. 11B is a cross-sectional view taken along the line XIB-XIB of a structure illustrated in FIG. 11A.

As illustrated in FIGS. 11A and 11B, the insulating layer 130 is subjected to etching. The etching is performed using the etching resist 132 as a mask. More specifically, the insulating layer 130 is subjected to etching (for example, dry etching) in a first region 133 located above the metal pattern 118 (specifically, one of the drain electrode 122 and the source electrode 124) and a second region 135 of the semiconductor pattern 116. The second region 135 is located above the first portion 126 and the second portions 128 of the semiconductor pattern 116, and the metal pattern 118 on the first portion 126.

In the etching step, the insulating layer 130 in the first region 133 is subjected to etching to form a through hole 134 for electrical connection to the metal pattern 118 (specifically, one of the drain electrode 122 and the source electrode 124) (see FIG. 11A). At the same time, the insulating layer 130 and the semiconductor pattern 116 in the second region 135 are subjected to etching. At this time, the second portions 128 of the semiconductor pattern 116 are removed while leaving the first portion 126 unremoved, with the use of the metal pattern 118 on the first portion 126 as a mask. Details of the etching correspond to the contents described in the first embodiment.

According to this embodiment, the second portions 128 of the semiconductor pattern 116 is removed in a step of forming the through hole 134 for electrical connection, and hence the semiconductor pattern 116 may be appropriately processed without increasing the number of manufacturing steps.

More specifically, if the second portions 128 of the semiconductor pattern 116 which outwardly extend off the wiring 120 are left unremoved, light scattering occurs. In order to prevent the light scattering, it has been necessary to form a wide black matrix to cover the second portions. However, the second portions 128 are removed in this embodiment, and hence the width of the black matrix may be smaller. Accordingly, decrease in aperture ratio may be prevented.

Figure 12:
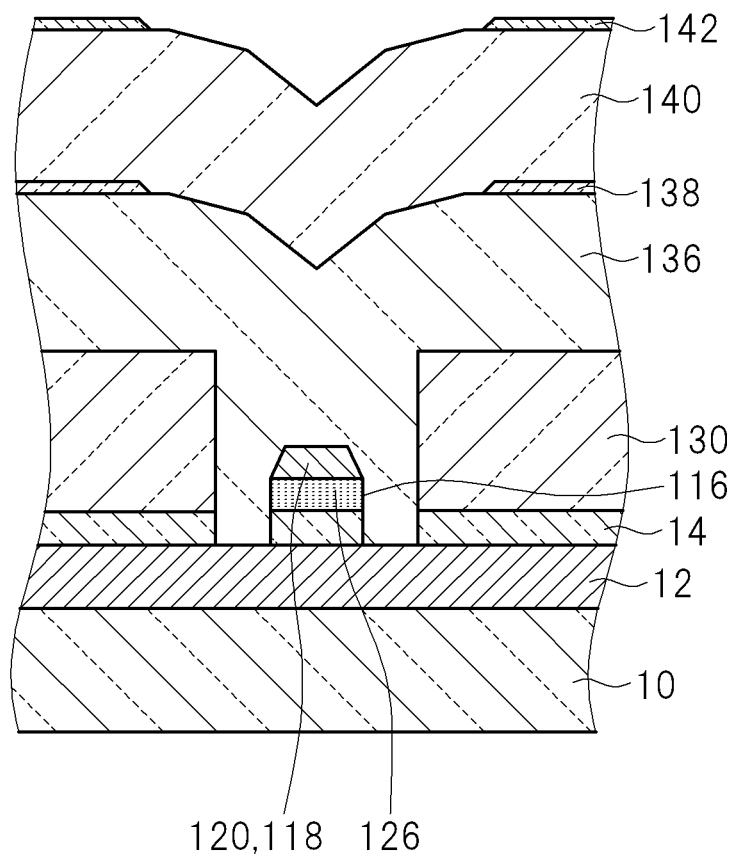
FIG. 12 is a view illustrating the manufacturing method for a liquid crystal display device according to the second embodiment of the present invention.

As illustrated in FIG. 12, after the etching step, spaces formed by removing the second portions 28 are each filled with an insulating material (inorganic material or organic material), to thereby form a first passivation film 136. The first passivation film 136 is formed so as to be laid on the insulating layer 130.

In a case of the in-plane switching (IPS) liquid crystal display device, a first electrode 138 is formed on the first passivation film 136. Then, a second passivation film 140 is formed on the first passivation film 136 so as to cover the first electrode 138, and a second electrode 142 is formed thereon. One of the first electrode 138 and the second electrode 142 serves as a pixel electrode, while the other thereof serves as a common electrode. The pixel electrode and the common electrode are formed of a transparent conductive material such as indium tin oxide (ITO).

Figure 13:
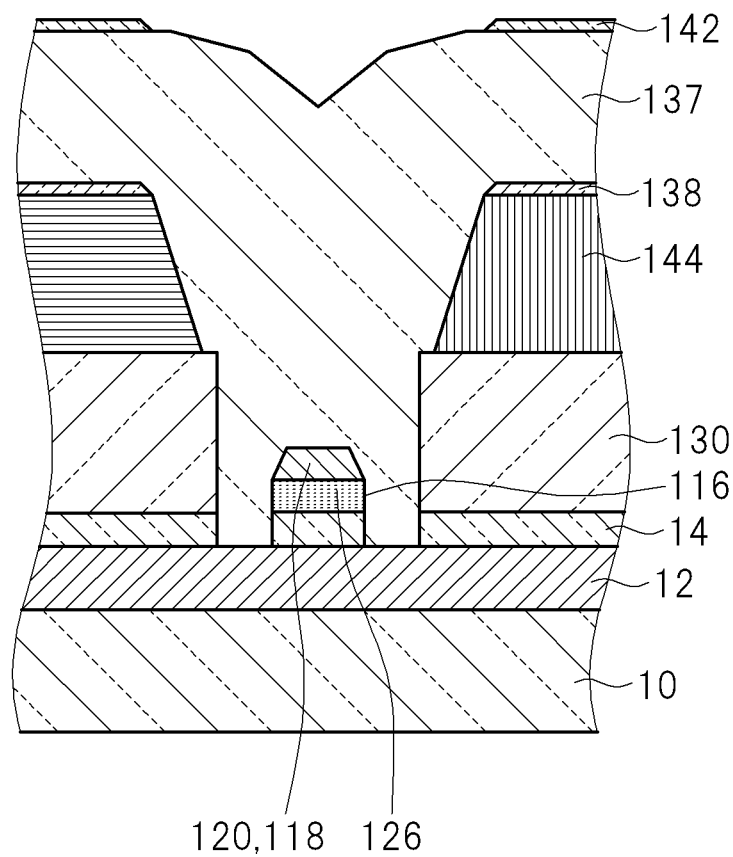
FIG. 13 is a view illustrating a first modified example of the second embodiment.

A first modified example may be configured as follows. As illustrated in FIG. 13, a color filter layer 144 may be formed in a region avoiding the spaces formed by removing the second portions 128, and the spaces formed by removing the second portions 128 may be filled with an insulating material (inorganic material, organic material, material for color filter, or light shielding material), to thereby form a passivation film 137. The passivation film 137 is formed so as to be laid on the color filter layer 144. In the case of the in-plane switching (IPS) liquid crystal display device, the first electrode 138 is formed on the color filter layer 144. Then, the passivation film 137 is formed on the color filter layer 144 so as to cover the first electrode 138, and the second electrode 142 is formed thereon. One of the first electrode 138 and the second electrode 142 serves as a pixel electrode, while the other thereof serves as a common electrode.

Figure 14:
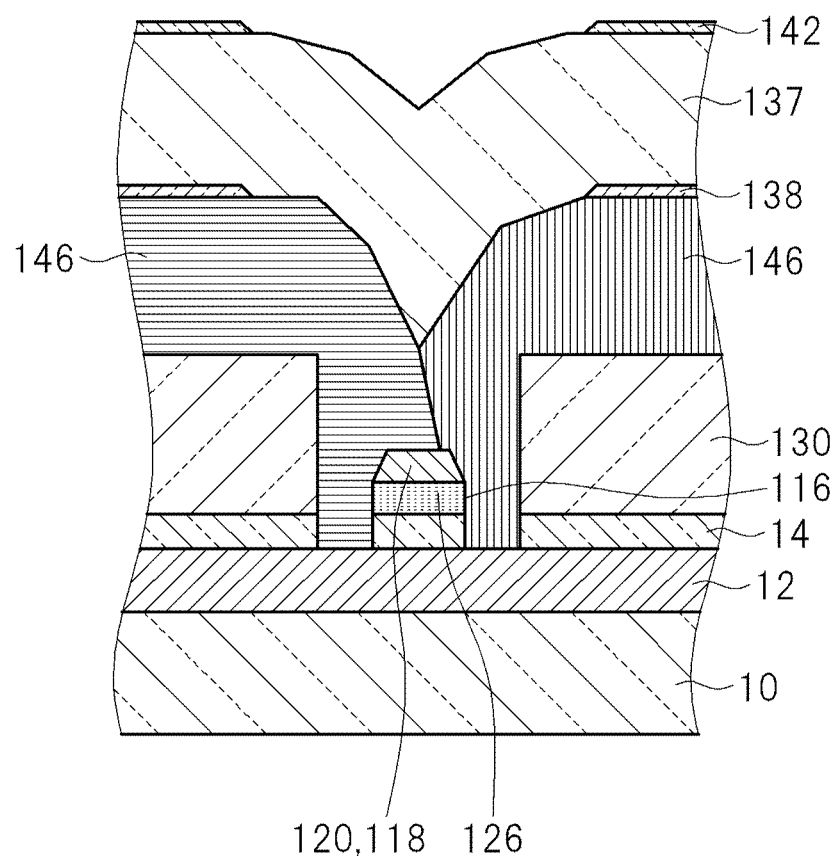
FIG. 14 is a view illustrating a second modified example of the second embodiment.

A second modified example may be configured as follows. As illustrated in FIG. 14, a material of a colored layer 146 providing at least one color of a color filter may be used as the insulating material for filling the spaces formed by removing the second portions 128. For example, ends of adjacent colored layers 146 in the color filter layer 144 are brought together to fill the spaces formed by removing the second portions 128. Then, the passivation film 137 is formed on the color filter layer 144. Other structures are the same as those exemplified in FIG. 13.

Figure 15:
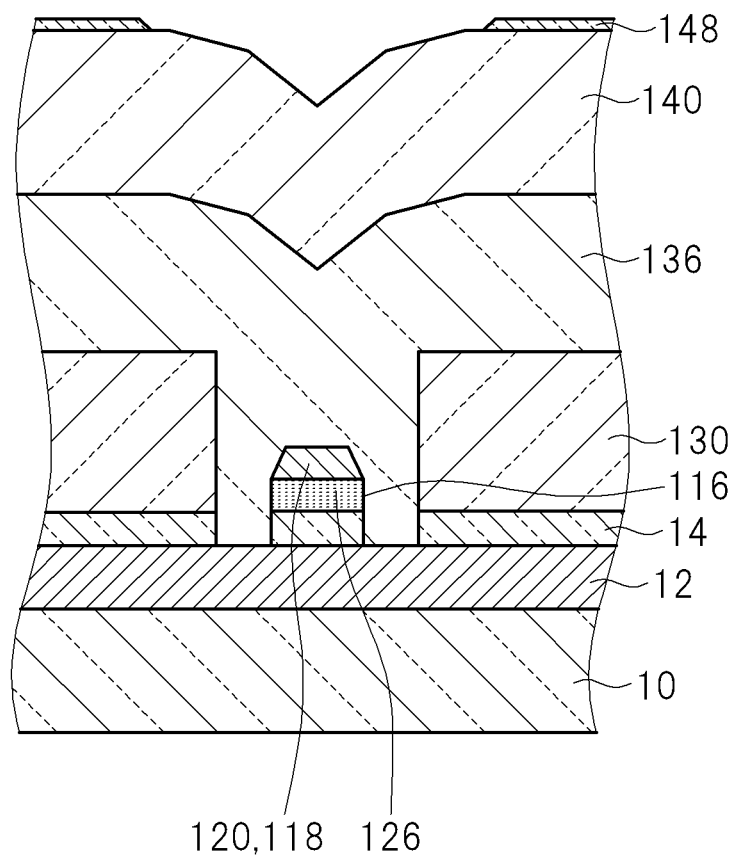
FIG. 15 is a view illustrating a third modified example of the second embodiment.
Figure 16:
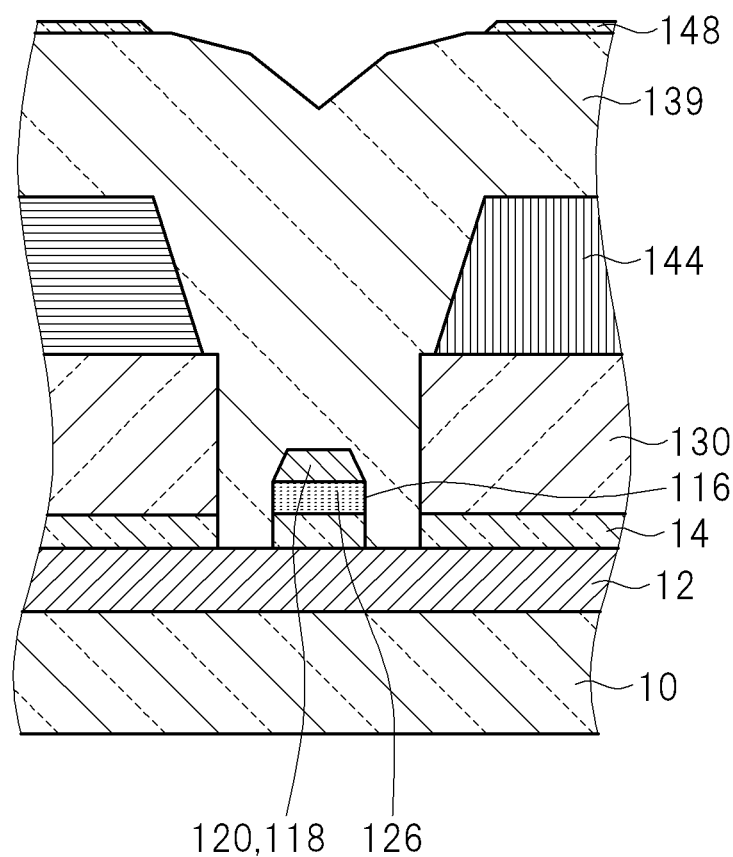
FIG. 16 is a view illustrating a fourth modified example of the second embodiment.
Figure 17:
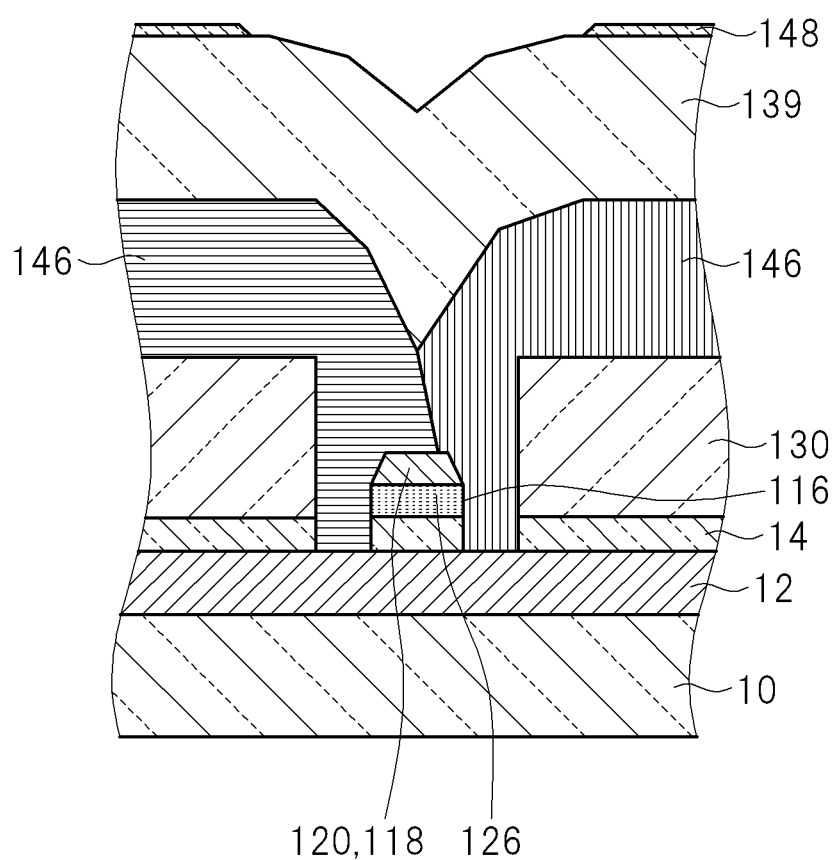
FIG. 17 is a view illustrating a fifth modified example of the second embodiment.

Other modified examples may be configured as follows. In order to modify the liquid crystal display device exemplified in FIG. 12 to a vertical alignment (VA) liquid crystal display device, as illustrated in FIG. 15, a pixel electrode 148 is formed on the second passivation film 140. Further, in order to modify the liquid crystal display device exemplified in FIG. 13 to a vertical alignment (VA) liquid crystal display device, as illustrated in FIG. 16, the pixel electrode 148 is formed on a passivation film 139. Further, in order to modify the liquid crystal display device exemplified in FIG. 14 to a vertical alignment (VA) liquid crystal display device, as illustrated in FIG. 17, the pixel electrode 148 is formed on the passivation film 139.

After that, a well-known manufacturing process for the liquid crystal display device is performed, and thus the liquid crystal display device may be manufactured.

Third Embodiment

Figure 18:
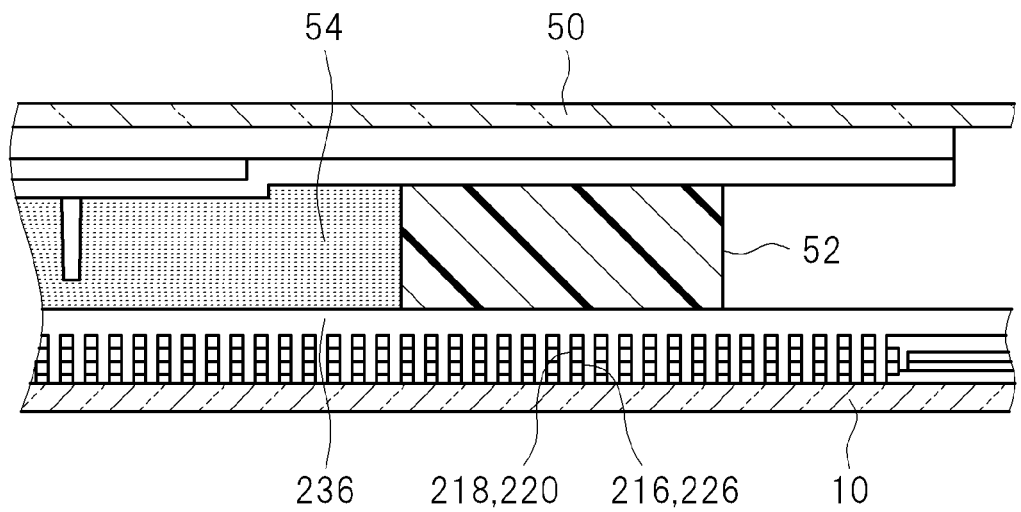
FIG. 18 is a view of a liquid crystal display device according to a third embodiment of the present invention.

FIG. 18 is a view of a liquid crystal display device according to a third embodiment of the present invention.

In a manufacturing method for the liquid crystal display device according to this embodiment, steps described in at least one of the first embodiment and the second embodiment are performed. After that, liquid crystal 54 is provided between the first substrate 10 and a second substrate 50 facing the first substrate 10, the liquid crystal 54 being surrounded by a seal portion 52 so as to be sealed.

The liquid crystal display device in this embodiment includes the first substrate 10 on which thin-film transistors are formed, the second substrate 50 facing the first substrate 10, the liquid crystal 54 provided between the first substrate 10 and the second substrate 50, and the seal portion 52 formed around the liquid crystal 54 between the first substrate 10 and the second substrate 50.

In the first substrate 10, a semiconductor pattern 216 and a metal pattern 218 are formed in a state in which the semiconductor pattern 216 is formed under the metal pattern 218. The semiconductor pattern 216 corresponds to the semiconductor pattern 16 described in the first embodiment or the semiconductor pattern 116 described in the second embodiment, and the metal pattern 218 corresponds to the metal pattern 18 described in the first embodiment or the metal pattern 118 described in the second embodiment.

Side surfaces of the semiconductor pattern 216 (first portion 226) and side surfaces of the metal pattern 218 (wiring 220) are flush with each other. Those side surfaces are covered with an insulating material 236. As described in the first embodiment and the second embodiment, the passivation film or the color filter layer is formed of the insulating material 236. The first portion 226 corresponds to the first portion 26 described in the first embodiment or the first portion 126 described in the second embodiment, and the wiring 220 corresponds to the wiring 20 described in the first embodiment or the wiring 120 described in the second embodiment. The insulating material 236 corresponds to the material of the first passivation film 36, the passivation films 37 and 39, or the colored layer 16 described in the first embodiment, or the first passivation film 136, the passivation films 137 and 139, or the colored layer 146 described in the second embodiment.

According to this embodiment, the semiconductor pattern 216 does not extend off the metal pattern 218 (wirings 220), and hence the wirings 220 may be arranged at a narrow pitch.

Fourth Embodiment

Figure 19:
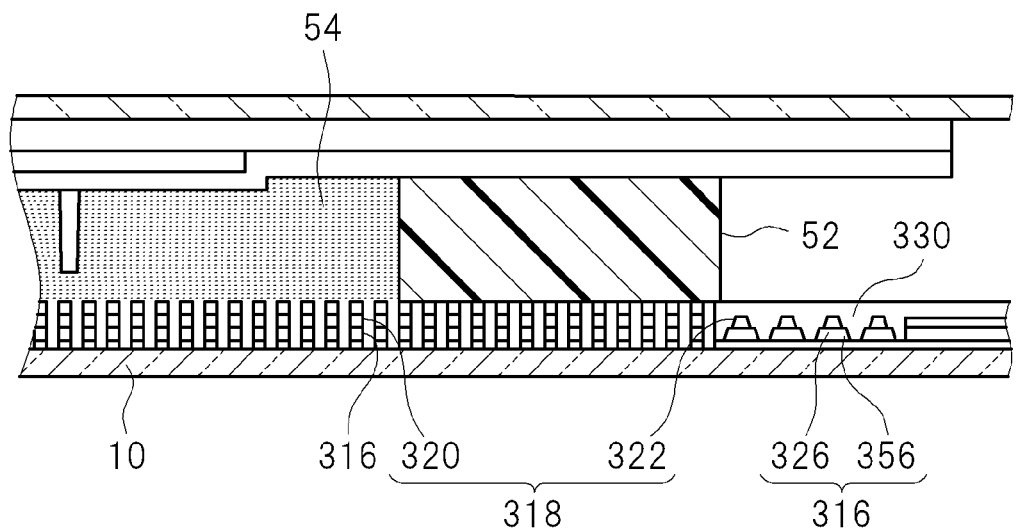
FIG. 19 is a view of a liquid crystal display device according to a fourth embodiment of the present invention.

FIG. 19 is a view of a liquid crystal display device according to a fourth embodiment of the present invention.

In a manufacturing method for the liquid crystal display device according to this embodiment, steps described in at least one of the first embodiment and the second embodiment are performed.

More specifically, a metal pattern 318 includes a plurality of first wirings 320 formed in a region surrounded by the seal portion 52. The plurality of first wirings 320 are arranged in parallel to one another with a gap formed therebetween. In the patterning process for the semiconductor pattern 316, the second portions (see second portions 128 of FIG. 10B) located below the region between the adjacent first wirings 320 are removed (see second embodiment). Details of the semiconductor pattern 316 correspond to the description of the semiconductor pattern 16 given in the first embodiment or the description of the semiconductor pattern 116 given in the second embodiment, and details of the metal pattern 318 correspond to the description of the metal pattern 18 given in the first embodiment or the description of the metal pattern 118 given in the second embodiment.

In this embodiment, the present invention in not applied in a region (region which is exposed to outside air) provided outside the region surrounded by the seal portion 52. In other words, the metal pattern 318 includes a plurality of second wirings 322 located outside the region surrounded by the seal portion 52. The plurality of second wirings 322 are arranged in parallel to one another with a gap formed therebetween. A third portion 356 of the semiconductor pattern 316 is located below a region between the adjacent second wirings 322, and the third portion 356 is left unremoved.

In this state, the liquid crystal 54 is provided between the first substrate 10 and the second substrate 50 facing the first substrate 10, the liquid crystal 54 being surrounded by the seal portion 52 so as to be sealed.

The liquid crystal display device in this embodiment includes the first substrate 10 on which thin-film transistors are formed, the second substrate 50 facing the first substrate 10, the liquid crystal 54 provided between the first substrate 10 and the second substrate 50, and the seal portion 52 formed so as to surround the liquid crystal 54 between the first substrate 10 and the second substrate 50.

In the first substrate 10, the semiconductor pattern 316 and the metal pattern 318 are formed in a state in which the semiconductor pattern 316 is formed under the metal pattern 318. The semiconductor pattern 316 and the metal pattern 318 are formed so as to reach, from the region surrounded by the seal portion 52, the region outside the region surrounded by the seal portion 52.

In the region surrounded by the seal portion 52, side surfaces of the semiconductor pattern 316 and side surfaces of the metal pattern 318 are flush with each other. Those side surfaces are blocked from outside air even though the side surfaces are not covered with the insulating material, because the side surfaces are within a region in which the liquid crystal 54 is sealed.

In the region outside the region surrounded by the seal portion 52, the semiconductor pattern 316 includes the first portion 326 formed under the metal pattern 318 (second wiring 322) and the third portion 356 which extends off the metal pattern 318. The third portion 356 represents a portion which is left unremoved, which is different from the second portion 328 which is removed as described above. In other words, in the region outside the region surrounded by the seal portion 52, a step of removing the portion which extends off the metal pattern 318 of the semiconductor pattern 316 is not performed, and hence the insulating layer 330 on the portion is not subjected to etching. Therefore, the second wiring 322 is in a state of being covered with the insulating layer 330.

The present invention is not limited to the embodiments described above, and various modifications may be made thereto. For example, the structures described in the embodiments may be replaced by a structure having substantially the same structure, a structure providing the same action and effect, and a structure which may achieve the same object.

What is claimed is:

1. A manufacturing method for a liquid crystal display device, comprising:

forming a semiconductor pattern and a metal pattern on a first substrate, the semiconductor pattern including a first portion formed under the metal pattern and a second portion which outwardly extends out from the metal pattern of the first portion;

forming a first insulating layer for covering the metal pattern and the semiconductor pattern;

etching the first insulating layer in a first region located above the metal pattern and in a second region located above at least the second portion of the semiconductor pattern so as to remove the second portion and form an etched space;

filling the etched space with a second insulating layer, and forming an electrode on the second insulating layer; and then providing liquid crystal between the first substrate and a second substrate facing the first substrate, the liquid crystal being surrounded by a seal portion so as to be sealed, wherein the etching comprises etching, in the first region, the first insulating layer to form a through hole for electrical connection to the metal pattern, and etching, in the second region, the first insulating layer and the semiconductor pattern to remove the second portion of the semiconductor pattern, and each side of the metal pattern and the semiconductor pattern facing the etched space is contacted by the second insulating layer.

2. The manufacturing method for a liquid crystal display device according to claim 1, wherein:

the metal pattern comprises a plurality of wirings arranged in parallel to one another with a gap formed therebetween; and the second portion of the semiconductor pattern is located below a region between adjacent wirings of the plurality of wirings.

3. The manufacturing method for a liquid crystal display device according to claim 1, wherein:

the second region is located above the first portion and the second portion of the semiconductor pattern and the metal pattern on the first portion; and the etching comprises removing the second portion of the semiconductor pattern while leaving the first portion unremoved, with a use of the metal pattern on the first portion as a mask.

4. The manufacturing method for a liquid crystal display device according to claim 3, wherein:

the metal pattern comprises a wiring; and the second portion of the semiconductor pattern extends off each of both sides of the wiring in a width direction of the wiring.

5. The manufacturing method for a liquid crystal display device according to claim 1, wherein:

the metal pattern comprises a plurality of first wirings formed in a region surrounded by the seal portion and a plurality of second wirings formed in a region outside the region surrounded by the seal portion;

the plurality of first wirings are arranged in parallel to one another with a gap formed therebetween, and the second portion to be etched is located below a region between adjacent first wirings of the plurality of first wirings; and the plurality of second wirings are arranged in parallel to one another with a gap formed therebetween, and a third portion of the semiconductor pattern, which is to be left unremoved in the etching, is located below a region between adjacent second wirings of the plurality of second wirings.

6. The manufacturing method for a liquid crystal display device according to claim 5, further comprising, after the etching, filling a space formed by removing the second portion, with an insulating material.

7. The manufacturing method for a liquid crystal display device according to claim 1, wherein the insulating material comprises a material of a colored layer providing at least one color of a color filter.

8. The manufacturing method for a liquid crystal display device according to claim 1, wherein the insulating material comprises a material of a colored layer providing at least one color of a color filter.

9. The manufacturing method for a liquid crystal display device according to claim 1, wherein the insulating material comprises a material of a colored layer providing at least one color of a color filter.

10. The manufacturing method for a liquid crystal display device according to claim 1, wherein the insulating material comprises a material of a colored layer providing at least one color of a color filter.

11. The manufacturing method for a liquid crystal display device according to claim 6, wherein the insulating material comprises a material of a colored layer providing at least one color of a color filter.

12. The manufacturing method for a liquid crystal display device according to claim 1, wherein the electrode is a pixel electrode.

13. The manufacturing method for a liquid crystal display device according to claim 1, wherein the electrode is a common electrode.

14. A manufacturing method for a liquid crystal display device according to claim 1, wherein the first insulating layer is covered by the second insulating layer.

* * * * *